(12) United States Patent
Dubois

(10) Patent No.: US 6,774,451 B2
(45) Date of Patent: Aug. 10, 2004

(54) MOS TRANSISTOR FOR HIGH DENSITY INTEGRATION CIRCUITS

(75) Inventor: Emmanuel Dubois, Quesnoy sur Deule (FR)

(73) Assignee: Centre National de la Recherche Scientifique, Paris (FR)

(*) Notice: Subject to any disclaimer, the term of this patent is extended or adjusted under 35 U.S.C. 154(b) by 0 days.

(21) Appl. No.: 10/204,530

(22) PCT Filed: Feb. 23, 2001

(86) PCT No.: PCT/FR01/00532
§ 371 (c)(1),
(2), (4) Date: Jan. 6, 2003

(87) PCT Pub. No.: WO01/63677
PCT Pub. Date: Aug. 30, 2001

(65) Prior Publication Data
US 2003/0094629 A1 May 22, 2003

(30) Foreign Application Priority Data
Feb. 23, 2000 (FR) .......................................... 00 02237

(51) Int. Cl.⁷ .......................................... H01L 27/095
(52) U.S. Cl. .......................... 257/471; 257/54; 257/73; 257/260; 257/449; 257/476

(58) Field of Search ............................. 257/10, 54, 73, 257/155, 192–195, 217, 260, 267, 269, 275–277, 280–284, 449–457, 471–486, 928

(56) References Cited

U.S. PATENT DOCUMENTS

| | | | | |
|---|---|---|---|---|
| 4,638,551 A | * | 1/1987 | Einthoven | 438/530 |
| 4,665,414 A | * | 5/1987 | Koeneke et al. | 257/376 |
| 4,696,093 A | * | 9/1987 | Welch | 438/571 |
| 5,663,584 A | * | 9/1997 | Welch | 257/288 |
| 6,495,882 B2 | * | 12/2002 | Snyder | 257/327 |

FOREIGN PATENT DOCUMENTS

| | | | |
|---|---|---|---|
| EP | 0 456 059 A1 | * 11/1991 | |
| EP | 0 469 611 A1 | 2/1992 | .......... H01L/29/72 |

* cited by examiner

Primary Examiner—David Nelms
Assistant Examiner—Andy Huynh
(74) Attorney, Agent, or Firm—Thelen Reid & Priest LLP

(57) ABSTRACT

This invention relates to a MOS transistor made in the thin film of silicon of an SOI chip (10), said thin film (13) being slightly doped and of less than 30 nm in thickness, the source (14) and drain (15) contacts being of the Schottky type at the lowest level of Schottky barrier possible for majority carriers, with an accumulation type transistor operation.

6 Claims, 1 Drawing Sheet

MOS TRANSISTOR FOR HIGH DENSITY INTEGRATION CIRCUITS

TECHNICAL FIELD

This invention concerns a MOS transistor that can be used to make high density integrated circuits.

STATE OF THE PRIOR ART

FIG. 1 is a schematic diagram of the structure of a traditional MOS transistor. It shows an n channel MOS transistor. It is made on a type p solid silicon chip 1. Two sections 2 and 3 of type $n^+$ are created, for example by ionic implantation, to form respectively the transistor's source and drain. Reference 4 indicates the gate oxide film created on the surface of the chip 1 under which the sections 2 and 3 extend beyond. A gate electrode 5 is deposited on the gate oxide film 4. Source 6 and drain 7 electrodes are respectively created on sections 2 and 3 and the transistor is insulated from surrounding devices by an oxide film 8. The channel 9 is also shown, which is formed under the gate oxide film 4 when the transistor is correctly biased. The following important parameters are also shown in the diagram:

the channel length L, the thickness of the gate oxide film d, the depth of the junction $r_j$.

The interest sustained in the development of high density integration, high frequency and low consumption silicon technologies is largely due to the new demands for portability, in particular for telecommunications and computer equipment. The exponential growth of technical and economic performances (according to Moore's law) in silicon microelectronics is a strong indicator of the most impressive industrial progress of the twentieth century.

The widespread use of MOSFET transistors in the production of integrated circuits has enabled the density of integration to be increased significantly. However, the sustained growth in density of integration and performances of the electronics runs the risk of finding the physical limits of manufacturing. As an initial estimate, it is accepted that a reduction by a factor $\alpha$ in the length of a MOSFET transistor gate must also be accompanied by a simultaneous reduction by a factor $\alpha$ in the other characteristic dimensions (thickness of the gate oxide, width of channel, depth of junction), by a reduction by a factor $\alpha$ of the input voltage and an increase by a factor $\alpha$ in the doping concentration in the channel.

It is currently possible to obtain a minimum gate dimension of 22 nm. However, such a reduction implies modifications to the other characteristic dimensions of the transistor, which are impossible to achieve either now or in the near future, according to "The International Technology Roadmap for Semiconductors—ITRS", 1999, SIA Semiconductor Industry Association.

The technological barriers preventing the manufacture of a traditional MOS transistor with a gate length of 22 nm are in particular as follows:

I): very shallow extension from the source and drain to their junction with the channel (from 8 to 13 nm);

II): an extremely abrupt concentration gradient at the source/channel and drain/channel junctions (0.5 nm/dec.);

III): a very thin film of silicon (12 nm);

IV): lower consumption of silicon during silicide coating reaction (from 7 to 17 nm);

V): low resistance by silicon square due to its reduced thickness (12.5 $\Omega$/for a thickness of silicon of 12 nm);

VI): a very low specific drain and source contact resistance at the silicon—silicide interface (less than 1.5 $10^{-8}$ $\Omega/cm^2$);

VII): a very high level of doping in the channel ($3 \times 10^{19}$ $cm^3$).

The miniaturisation of MOS devices requires shorter and shorter junctions to be formed, which makes optimising the specific contact resistance extremely difficult. The reduction of this resistance is usually achieved by a silicide deposition process, which permits an alloy to be obtained with low resistance at the silicide—silicon interface, for example the $TiS_2/Si$ and $CoSi_2/Si$ interfaces. However, the reaction of the silicide deposition process leads to a consumption of silicon which can lead, on the one hand, to a reduction of the effective contact surface and, on the other hand, to an increase in the specific contact resistance given that the silicide—silicon interface values are too low.

The article "Proposal of a SCHOTTKY barrier SET Aiming at a Future Integrated Device" by FUJISHIMA et al., published in the IEICE Transactions on Electronics, JP Institute of Electronics Information and Comm. Eng. Tokyo, vol. E 80-C, no°7, Jul. $1^{st}$, 1997, pages 881 to 885, reveals a one electron MOS transistor. This device uses the Coulomb effect, which is to say a load quantification effect, which allows the current to be oscillated according to the gate voltage applied. Several constraints are imposed in this case. The transistor must operate at low temperature (e.g. 10 K) so that the load quantification is not masked by the load temperature fluctuations. It is formed by a silicon channel whose external connection (source and drain contacts) passes via the Schottky barriers, which act as a tunnel barrier. In order to use the Coulomb blocking effect, the tunnel resistance of the Schottky barriers must be greater than the resistance quantum. This constraint justifies the use of relatively high Schottky barriers. Finally, the device described in this article is a quantum wire on non-doped silicon, which means that the width of the device is significantly reduced. This very narrow width is essential for the operation of the SET transistor in order to reduce all of the capacities between the transistor terminal contacts and the silicon channel, as the Coulomb blockage can only be achieved if very low capacities are used. The very narrow width of the device allows a relatively high junction tunnel resistance to be obtained, as the resistance is inversely proportional to the emission surface.

DESCRIPTION OF THE INVENTION

This invention allows the problems of manufacturing MOS transistors for high density integrated circuits to be overcome.

It concerns a MOS transistor made in the thin film of silicon of an SOI chip, said thin film being slightly doped and of less than 30 nm in thickness, the source and drain contacts being of the Schottky type at the lowest level of Schottky barrier possible for majority carriers, with an accumulation type transistor operation.

In preference, the level of doping of the thin film is between $5 \times 10^{14}$ $cm^{-3}$ and $10^{17}$ $cm^{-3}$. Advantageously, it is of around $10^{15}$ $cm^{-3}$, for example 1 or $2 \times 10^{15}$ $cm^{-3}$.

If the thin film is p doped, to obtain a p-MOSFET, the source and drain contacts are advantageously composed of a PtGeSi silicide. Annealing, for example at a temperature of around 600° C. for approximately 10 minutes, permits the Schottky barrier of these contacts to be lowered.

If the thin film is n doped to obtain an n-MOSFET, the source and drain contacts can be composed of an erbium based silicide.

BRIEF DESCRIPTION OF THE FIGURES

It will be easier to understand the patent and other advantages and specific characteristics will become apparent by reading the following description, given as an example and not exhaustive, accompanied by the appended diagrams included in which.

DETAILED DESCRIPTION OF THE EMBODIMENT OF THE INVENTION

Figure 1:
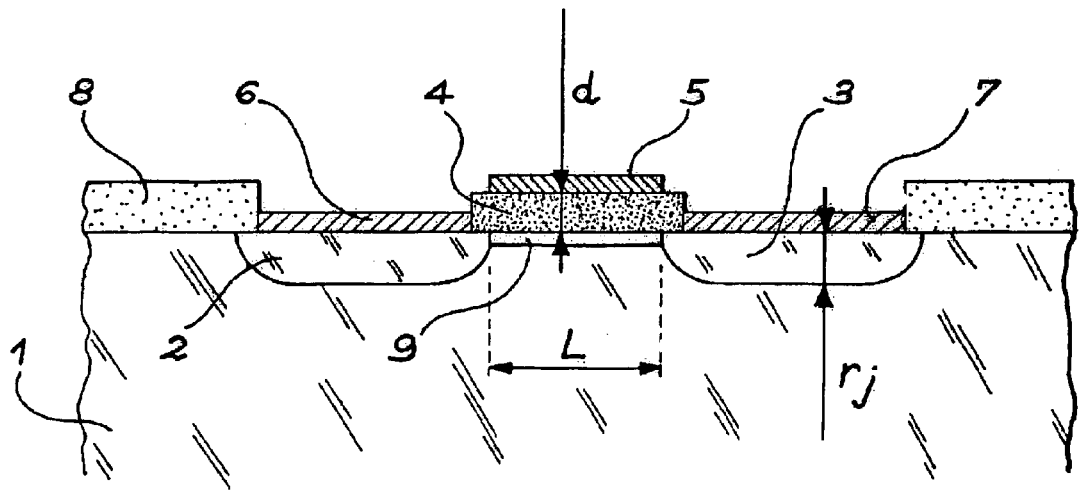
FIG. 1, already described, shows schematically the structure of a MOS transistor of the known technology, made on a solid silicon chip.
Figure 2:
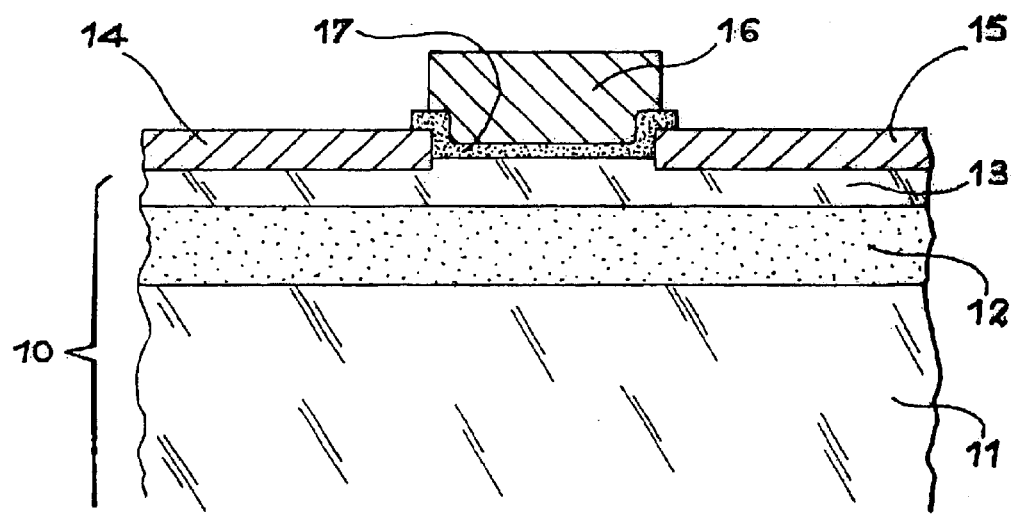
FIG. 2 shows schematically the structure of a MOS transistor according to this invention.

FIG. 2 shows schematically the structure of a MOS transistor according to this invention. This transistor is made on an SOI chip 10 formed by a silicon wafer 11 coated successively by a film of silicon dioxide 12 and a thin film of silicon 13.

The thin 13 or active film is less than 30 nm thick, typically between 5 and 20 nm. This film is lightly doped, for example around $10^{15}$ cm$^{-3}$. n type doping is used for an n-MOSFET and p type for a p-MOSFET.

The transistor has Schottky type source 14 and drain 15 contacts and a gate 16, which is electrically insulated from the rest of the structure by a gate insulating film 17, such as silicon dioxide.

The principle of its operation is that of an accumulation MOS transistor. The carries which make up the channel are the majority carriers of the chip, which is to say the holes for a p-MOS transistor on a p type SOI chip and the electrons for an n-MOS transistor on an n type SOI chip. The voltage applied to the gate controls the conduction channel established between the source and drain contacts. The device is put into conduction by a negative gate voltage for a p-MOS type transistor and by a positive gate voltage with respect to the source voltage for an n-MOS type transistor. The Schottky barrier should be as low as possible for the majority carriers and ideally equal to 0 eV.

The creation of source and drain zones by means of Schottky contacts directly on the thin silicon film enables the technological obstacles I and II mentioned above to be overcome.

As the thickness of the silicide and the corresponding consumption of silicon during the silicide deposition process reaction, this enables the technological obstacles III, IV and V to be overcome.

The technological obstacle VI is overcome by opting for a very low Schottky barrier for the source and drain contacts. In the case of a p-MOS transistor, it is possible to obtain a barrier level of around 0.05 eV, or a resistance of around $6.10^{-9}$ $\Omega$cm$^2$, by means of coating with a platinum or germanium—platinum alloy followed by annealing. For an n-MOS transistor, an erbium based silicon could make possible a barrier level of less than 0.2 eV.

The use of a thin silicon film which is only slightly doped, for example around $10^{15}$ cm$^{-3}$, for the SOI chip allows the technological obstacle VII to be overcome.

In the case of a p-MOS transistor, made on a slightly doped (for example around $10^{15}$ cm$^{-3}$) thin film, the source and drain contacts may be obtained as follows. A coat of germanium is deposited by evaporation in an ultra-vacuum. A coat of platinum is then deposited using the same process. Annealing at around 600° C. for 10 minutes usually is then carried out. The contacts obtained have very low barrier levels (around 0.05 eV). The specific contact resistance obtained is then around $6\times10^{-9}$ cm$^{-3}$ to $10^{-8}$ cm$^2$.

The source and drain Schottky contacts can be created before forming the gate. As a variation, it is possible to create the gate oxide first and then to deposit the gate material. The gate and self-aligned channel are then defined by etching. The coating of the source and drain contacts only occurs afterwards by self-alignment following the silicide deposition process reaction.

What is claimed is:

1. A MOS transistor made in a thin silicon film of an SOI chip, said thin film being slightly doped and of less than 30 nm in thickness, the source and drain contacts being of the Schottky type with the Schottky barrier level of less than 0.2 eV for majority carriers, with an accumulation type transistor operation.

2. The MOS transistor according to claim 1, wherein the doping level of said thin film is between $5\times10^{14}$ cm$^{-3}$ and $10^{17}$ cm$^{-3}$.

3. The MOS transistor according to claim 2, in which the doping level of said thin film is approximately $10^{15}$ cm$^{-3}$.

4. The MOS transistor according to any of claim 1, in which if said thin film is p doped, the source and drain contacts are composed of a PtGeSi silicide.

5. The MOS transistor according to claim 4, in which the source and drain contacts are composed of a PtGeSi silicide annealed at a temperature of approximately 600° C. for approximately 10 minutes.

6. The MOS transistor according to claim 1, in which if said thin film is a doped, the source and drain contacts are composed of an erbium based silicide.

* * * * *